(12) United States Patent
Zhang et al.

(10) Patent No.: US 9,240,758 B2
(45) Date of Patent: Jan. 19, 2016

(54) VOLTAGE REGULATOR AND METHOD OF REGULATING VOLTAGE

(71) Applicant: Montage Technology (Shanghai) Co., Ltd., Shanghai (CN)

(72) Inventors: Pengzhan Zhang, Shanghai (CN); Gang Yan, Shanghai (CN)

(73) Assignee: MONTAGE TECHNOLOGY (SHANGHAI) CO., LTD., Shanghai (CN)

( * ) Notice: Subject to any disclaimer, the term of this patent is extended or adjusted under 35 U.S.C. 154(b) by 115 days.

(21) Appl. No.: 14/194,726

(22) Filed: Mar. 1, 2014

(65) Prior Publication Data

US 2015/0214903 A1 Jul. 30, 2015

(30) Foreign Application Priority Data

Jan. 27, 2014 (CN) .......................... 2014 1 0041038

(51) Int. Cl.
| | |
|---|---|
| H03F 1/38 | (2006.01) |
| H03F 1/30 | (2006.01) |
| H03F 3/16 | (2006.01) |
| H03F 3/345 | (2006.01) |
| G05F 1/46 | (2006.01) |
| G05F 3/24 | (2006.01) |

(52) U.S. Cl.
CPC ................ *H03F 1/301* (2013.01); *G05F 1/468* (2013.01); *G05F 3/242* (2013.01); *H03F 3/16* (2013.01); *H03F 3/345* (2013.01); *H03F 2200/447* (2013.01)

(58) Field of Classification Search
USPC .......................... 330/291, 260, 261; 327/540
IPC ......................................................... H03F 1/38
See application file for complete search history.

(56) References Cited

U.S. PATENT DOCUMENTS

| | | | | |
|---|---|---|---|---|
| 5,275,035 | A * | 1/1994 | Baer ............................... 73/1.61 |
| 5,859,526 | A * | 1/1999 | Do et al. ........................ 323/280 |
| 7,898,332 | B2 * | 3/2011 | Deguchi et al. ............... 330/259 |
| 8,154,263 | B1 * | 4/2012 | Shi et al. ........................ 323/269 |
| 8,994,452 | B2 * | 3/2015 | Kim et al. ...................... 330/257 |
| 2004/0207379 | A1 * | 10/2004 | Camara et al. ................. 323/313 |
| 2012/0319738 | A1 * | 12/2012 | Nakamura et al. ............. 327/102 |
| 2013/0003995 | A1 * | 1/2013 | Poulsen ......................... 381/121 |

* cited by examiner

*Primary Examiner* — Patricia T Nguyen
(74) *Attorney, Agent, or Firm* — Perkins Coie LLP

(57) ABSTRACT

A voltage regulator comprises a first amplifier and a biasing unit. The first amplifier has a positive input, a negative input and an output, wherein the output of the amplifier is connected to the negative input. The biasing unit generates a reference voltage by Complementary Metal-Oxide-Semiconductor transistors, wherein the positive input of the first amplifier is configured to receive the reference voltage.

19 Claims, 14 Drawing Sheets

VOLTAGE REGULATOR AND METHOD OF REGULATING VOLTAGE

CLAIM OF PRIORITY

This application claims priority to Chinese Application No. 201410041038.3 entitled "VOLTAGE REGULATOR AND METHOD OF REGULATING VOLTAGE", filed on Jan. 27, 2014 by Montage Technology (Shanghai) Co., Ltd., which is incorporated herein by reference.

TECHNICAL FIELD

The present disclosure relates to an integrated circuit, and more particularly, but not exclusively to voltage regulator and method of regulating voltage.

BACKGROUND

Bandgap references are widely used for Complementary Metal-Oxide-Semiconductor Transistor (CMOS) on-chip regulators. Bandgap references use the parasitic bi-polar transistors on CMOS process to generate the voltage related to bandgap of silicon. However, bandgap references cannot compensate for the Metal-Oxide-Semiconductor Field Effect Transistor (MOSFET) variation in process corner and temperature. The process corner refers to the variation of parameter in process. MOSFETs of different chips may exhibit different speed variation within a certain range. When a regulator is used to provide power supply to a digital circuit, the delay time of CMOS gates with different corner conditions will vary dramatically, which makes it harder to achieve the timing convergency for the digital circuit.

With the higher and higher speed achieved on an IC with nano-meter process, the margins for timing tolerance are getting smaller and smaller. It is desirable to design a new regulator with a reference voltage that can compensate for the variation in process corner and temperature of the CMOS.

SUMMARY OF THE INVENTION

In an embodiment, a circuit comprises a first amplifier and a biasing unit. The first amplifier has a positive input, a negative input and an output, wherein the output of the first amplifier is connected to the negative input. The biasing unit generates a reference voltage with Complementary Metal-Oxide-Semiconductor transistors, wherein the positive input of the first amplifier is configured to receive the reference voltage.

In another embodiment, a method comprises generating a first biasing current, wherein the first biasing current flows through a Complementary Metal-Oxide-Semiconductor (CMOS) transistor, such that a transconductance of the CMOS transistors is constant; generating a reference voltage based on the first biasing current; inputting the reference voltage into a positive input of an amplifier; and outputting a signal by the amplifier, wherein the output is fed back to a negative input of the amplifier.

In another embodiment, a method comprises generating a second biasing current tracking a threshold voltage of the Complementary Metal-Oxide-Semiconductor transistors; generating a reference voltage based on the second biasing current; inputting the reference voltage into a positive input of an amplifier; and outputting a signal by the amplifier, wherein the output is fed back to a negative input of the amplifier.

BRIEF DESCRIPTION OF THE DRAWINGS

The present invention is illustrated in an exemplary manner by the accompanying drawings. The drawings should be understood as exemplary rather than limiting, as the scope of the invention is defined by the claims.

DETAILED DESCRIPTION

Figure 1:
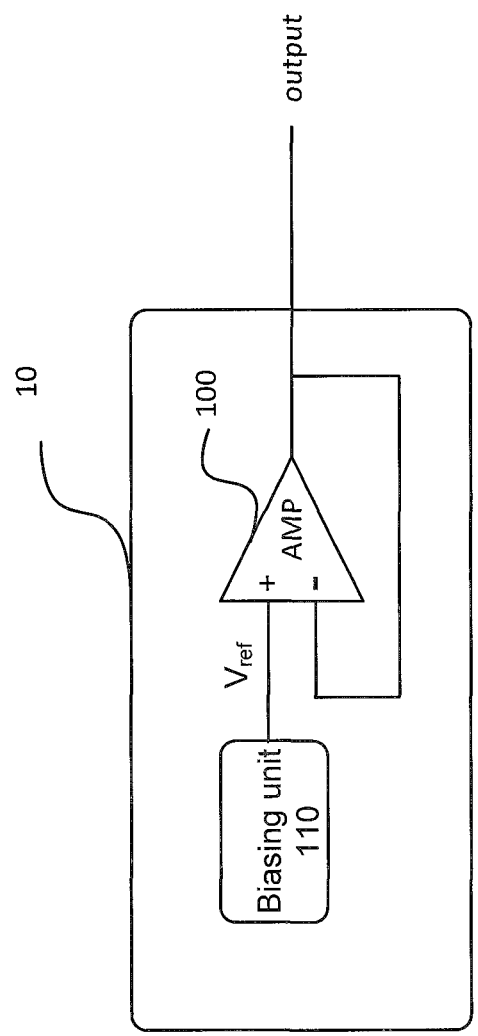
FIG. 1 is a block diagram illustrating an embodiment of the circuit.

FIG. 1 is a block diagram illustrating an embodiment of the circuit. In FIG. 1, the circuit 10 comprises a first amplifier 100 and a biasing unit 110. The first amplifier 100 has a positive input (+), a negative input (−) and an output, wherein the output of the first amplifier 100 is connected to the negative input. The biasing unit 110 generates a reference voltage with Complementary Metal-Oxide-Semiconductor (CMOS) transistors. The positive input of the first amplifier 100 receives the reference voltage outputted by the biasing unit 110. The circuit 10 can be a voltage regulator.

In this embodiment, the voltage regulator 10 is possible to automatically adapt to the speed of logic gates, because the voltage regulator uses MOSFET transistors as a reference voltage, and the logic gates mainly comprise MOSFET transistors. The voltage regulator is designed to be higher than the nominal voltage when the speed of the logic gate is slower, and the voltage regulator is designed to be lower than the nominal voltage when the speed of the MOSFET transistor is faster, so as to reduce the variation of delay time of the logic gates. The variation of temperature is also taken into consideration. The delay time of the logic gate can be set to be independent of the change of the temperature by adjusting the temperature coefficient of the MOSFET transistor of the regulator. Using the MOSFET instead of bandgap as a voltage reference can reduce the sensitivity of logic gate in response to process corner or temperature.

The biasing unit 110 may generates a first biasing current $I_1$ tracking a constant transconductance $g_m$ of the Complementary Metal-Oxide-Semiconductor (CMOS) transistors, and the reference voltage $V_{ref}$ is generated based on the first biasing current $I_1$. In other words, the first biasing current $I_1$ is used to bias the CMOS transistors, so that the transconductance $g_m$ is not sensitive to the temperature, process, or supply voltage.

Alternatively, in the circuit 10, the biasing unit 110 may generate a second biasing current $I_2$ tracking threshold voltage $V_{th}$ of the Complementary Metal-Oxide-Semiconductor transistors, and the reference voltage $V_{ref}$ is generated based on the second biasing current $I_2$. In other words, the second biasing current $I_2$ is used to bias the CMOS transistors, so that the reference voltage tracks threshold voltage $V_{th}$.

Figure 2:
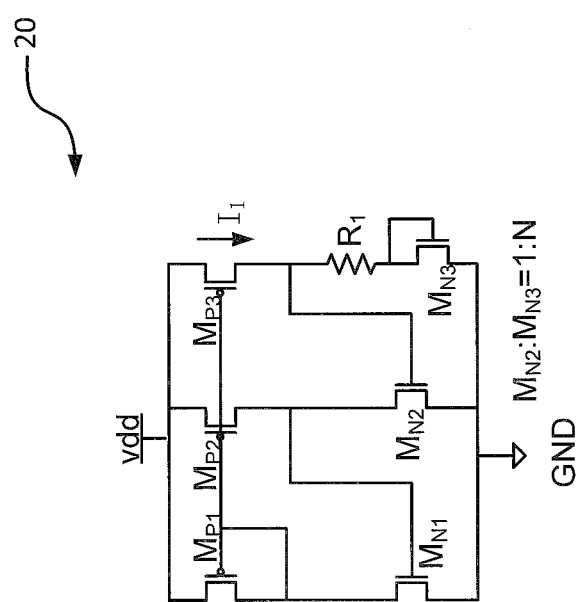
FIG. 2 is a diagram illustrating an embodiment of the biasing unit.

FIG. 2 is a diagram illustrating an embodiment of the biasing unit. In FIG. 2, the biasing unit 20 generates a first biasing current $I_1$, with which the transconductance gm of the CMOS transistors tracks the poly resistor only, and the reference voltage $V_{ref}$ is generated based on the first biasing current $I_1$. As shown in FIG. 2, the CMOS transistors include N-channel Metal Oxide Semiconductor (NMOS) transistors. The first biasing current $I_1$ is generated first, then the first biasing current $I_1$ is copied into another MOSFET. Note that any size of MOSFET with any portion of the current will have constant gm because the size and current only impact the MOSFET's absolute value and doesn't impact its process and temperature sensitivity. A poly resistor represents a type of resistor which standard logic process usually offers. The gm of the MOSFET is constant if the poly resistor is constant. Generally speaking, poly resistor has less process variation and less temperature sensitivity compared to active MOSFET.

The biasing unit 20 comprises a first P-channel Metal Oxide Semiconductor (PMOS) transistor $M_{P1}$, a second PMOS transistor $M_{P2}$, a third PMOS transistor $M_{P3}$, a first NMOS transistor $M_{N1}$, a second NMOS transistor $M_{N2}$, a third NMOS transistor $M_{N3}$, and a first resistor $R_1$.

Sources of the first, the second and the third PMOS transistors $M_{P1}$, $M_{P2}$, $M_{P3}$ are connected to a power supply Vdd. Both a gate and a drain of the first PMOS $M_{P1}$ transistor are connected to a drain of the first NMOS transistor $M_{N1}$. A gate of the second PMOS transistor $M_{P2}$ is connected to gates of both the first PMOS transistor $M_{P1}$ and the third PMOS transistor $M_{P3}$. A drain of the second PMOS transistor $M_{P2}$ is connected to both a gate of the first NMOS transistor $M_{N1}$ and a drain of the second NMOS transistor $M_{N2}$. A drain of the third PMOS transistor $M_{P3}$ is connected to a gate of the second NMOS transistor $M_{N2}$ and the first resistor $R_1$. The first resistor $R_1$ is connected to both a gate and a drain of the third NMOS transistor $M_{N3}$. Sources of the first, the second and the third NMOS transistors $M_{N1}$, $M_{N2}$, $M_{N3}$ are connected to ground. The drain of the third PMOS transistor $M_{P3}$ is configured to output the first biasing current $I_1$. The first biasing current $I_1$ flows through the NMOS transistor. The transconductance of the NMOS transistor is constant.

In FIG. 2, the sizes (including width/length (W/L) ratio and length) of PMOS transistors $M_{P1}$, $M_{P2}$ and $M_{P3}$ are the same. The ratio of sizes of $M_{N2}$ and $M_{N3}$ is 1:N. The current $I_1$ can be represented as $$I_1 = \frac{V_{GSN2} - V_{GSN3}}{R_1} = \frac{\Delta V_{GS}}{R_1}$$

Using the long-channel approximation, the drain current is proportional to the square of the gate-source voltage, then it can be obtained that $$g_{mN2} = 2 \cdot \left(1 - \frac{1}{\sqrt{N}}\right) \cdot \frac{1}{R_1} \quad (1)$$

In the above expression, the $g_m$ of the NMOS transistor is only relevant to resistance $R_1$ and the ratio N of the size of the two NMOS transistors $M_{N2}$ and $M_{N3}$, and is independent of process and temperature. When $I_1$ is used to bias NMOS transistors, the transconductance is independent of MOS process and temperature.

Alternatively, using the short-channel approximation, as the drain current is linear to the gate-source voltage, the transconductance can be represented as $$g_{mN2} = \frac{N-1}{N} \cdot \frac{1}{R_1} \quad (2)$$

Similarly, the $g_m$ of the NMOS transistor is only relevant to resistance $R_1$ and the ratio N of the size of the two NMOS transistors $M_{N2}$ and $M_{N3}$, and is independent of process and temperature (because the temperature coefficient of the poly resistor $R_1$ is relatively low). When $I_1$ is used to bias NMOS transistors, the transconductance is independent of MOS transistor process and temperature.

Note that in the biasing unit 20, the first current $I_1$ is obtained by dividing the difference of the gate-source voltages of $M_{N2}$ and $M_{N3}$, which is the difference of their overdrive voltage, by the resistance of $R_1$. Then the first current $I_1$ multiplies the resistance of $R_1$ to yield the overdrive voltage. The overdrive voltage maintains the NMOS transistors at a constant transconductance. Note that $V_{GS}-V_{th}$ is called the overdrive voltage, or sometimes called effective voltage. Therefore, if a MOSFET is desired to have certain overdrive voltage, the threshold voltage $V_{th}$ should be added to gate-source voltage.

Figure 3:
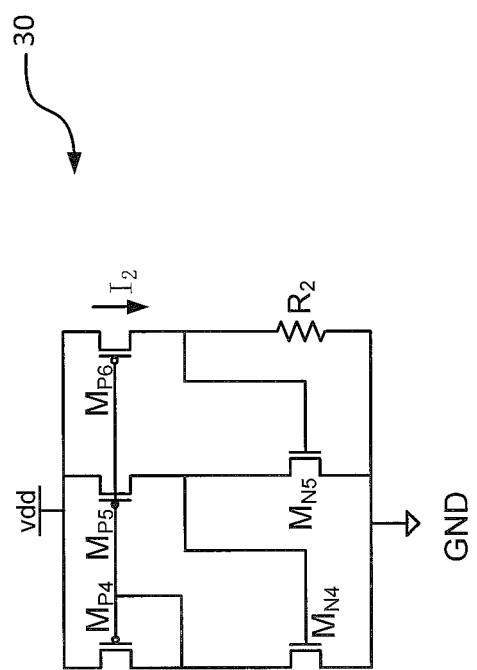
FIG. 3 is a diagram illustrating another embodiment of the biasing unit.

FIG. 3 is a diagram illustrating another embodiment of the biasing unit. In FIG. 3, the biasing unit 30 generates a second biasing current $I_2$ tracking a threshold voltage $V_{th}$ of the CMOS transistors, and the reference voltage $V_{ref}$ is generated based on the second biasing current $I_2$. The CMOS transistors include NMOS transistors.

The biasing unit 30 comprises a fourth PMOS transistor $M_{P4}$, a fifth PMOS transistor $M_{P5}$, a sixth PMOS transistor $M_{P6}$, a fourth NMOS transistor $M_{N4}$, a fifth NMOS transistor $M_{N5}$, and a second resistor $R_2$.

Sources of the fourth, the fifth and the sixth PMOS transistors $M_{P4}$, $M_{P5}$, $M_{P6}$ are connected to a power supply Vdd. Both a gate and a drain of the fourth PMOS $M_{P4}$ transistor are connected to a drain of the fourth NMOS transistor $M_{N4}$. A gate of the fifth PMOS transistor $M_{P6}$ is connected to gates of both the fourth PMOS transistor $M_{P4}$ the sixth PMOS transistor $M_{P6}$. A drain of the fifth PMOS transistor $M_{P5}$ is connected to a gate of the fourth NMOS transistor $M_{N4}$ and a drain of the fifth NMOS transistor $M_{N5}$. A drain of the sixth PMOS transistor $M_{P6}$ is connected to a gate of the fifth NMOS transistor $M_{N5}$ and the second resistor $R_2$. Sources of the fourth, the fifth NMOS transistors $M_{N4}$, $M_{N5}$ are connected to ground. The drain of the sixth PMOS transistor $M_{P6}$ is configured to output the second biasing current $I_2$. $I_2$ tracks a threshold voltage of the fifth NMOS transistor $M_{N5}$. Since all the same type of NMOS transistors on a chip has the same threshold voltage, $I_2$ tracks all the threshold voltage of this type of NMOSFET.

In FIG. 3, the second biasing current $I_2$ is calculated by $$I_2 = \frac{V_{GSN5}}{R_2}.$$

Given a same current, when the size of the fifth NMOS transistor $M_{N5}$ is large, the current density is low, its overdrive voltage is small, and the fifth NMOS transistor $M_{N5}$ operates in the sub-threshold region. Therefore the gate-source voltage of the fifth NMOS transistor $M_{N5}$ approximates to the threshold voltage. That is $$I_2 = \frac{V_{GSN5}}{R_2} \approx \frac{V_{thN5}}{R_2}.$$

Figure 4:
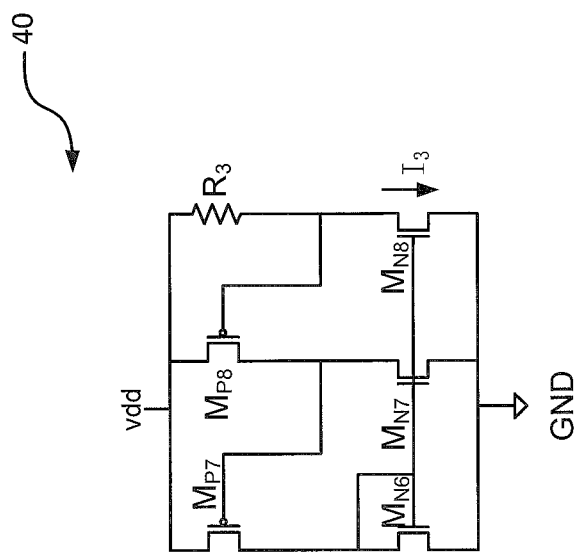
FIG. 4 is a diagram illustrating another embodiment of the biasing unit.

FIG. 4 is a diagram illustrating another embodiment of the biasing unit. As shown in FIG. 4, the biasing unit 40 generates a third biasing current $I_3$ tracking a threshold voltage $V_{th}$ of the CMOS transistors, and the reference voltage $V_{ref}$ is generated based on the third biasing current $I_3$. The CMOS transistors comprise PMOS transistors. In other words, the third biasing current $I_3$ tracks a threshold voltage $V_{th}$ of the PMOS transistors. The biasing unit 40 comprises a sixth NMOS transistor $M_{N6}$, a seventh NMOS transistor $M_{N7}$, an eighth NMOS transistor $M_{N8}$, a seventh PMOS transistor $M_{P7}$, an eighth PMOS transistor $M_{P8}$, and a third resistor $R_3$.

Sources of the sixth, the seventh and the eighth NMOS transistors $M_{N6}$, $M_{N7}$, $M_{N8}$ are connected to ground GND. Both a gate and a drain of the sixth NMOS transistor $M_{N6}$ are connected to both a drain of the seventh PMOS $M_{P7}$ and a gate of the seventh NMOS transistor $M_{N7}$. The gate of the seventh NMOS transistor $M_{N7}$ is connected to a gate of the eighth NMOS transistor $M_{N8}$. A drain of the seventh NMOS transistor $M_{N7}$ is connected to a gate of the seventh PMOS transistor $M_{P7}$ and a drain of the eighth PMOS transistor $M_{P8}$. A drain of the eighth NMOS transistor $M_{N8}$ is connected to a gate of the eighth PMOS transistor $M_{P8}$ and the third resistor $R_3$. Sources of the seventh and the eighth PMOS transistors $M_{P7}$, $M_{P8}$ are connected to the power supply Vdd. The drain of the eighth NMOS transistor $M_{N8}$ is configured to output the third biasing current $I_3$. The third biasing current $I_3$ tracks a threshold voltage the PMOS transistor $M_{P8}$.

Note that FIG. 4 is similar to FIG. 3, except that the PMOS transistors and the NMOS transistors are interchanged and the power supply Vdd and the ground GND are interchanged.

In FIG. 4, the third biasing current $I_3$ is calculated by $$I_3 = \frac{V_{GSP8}}{R_3}.$$

When the size of the eighth PMOS transistor $M_{P8}$ is large, its overdrive voltage is small, and the eighth PMOS transistor $M_{P8}$ operates in the sub-threshold region. Therefore the gate-source voltage of the eighth PMOS transistor $M_{P8}$ approximates to the threshold voltage. Therefore, $$I_3 = \frac{V_{GSP8}}{R_3} \approx \frac{V_{thP8}}{R_3}.$$

Figure 5:
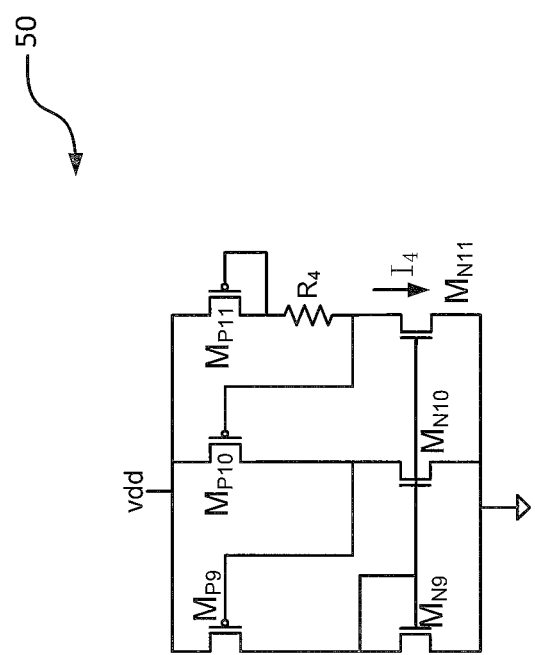
FIG. 5 is a diagram illustrating another embodiment of the biasing unit.

FIG. 5 is a diagram illustrating another embodiment of the biasing unit. In FIG. 5, the biasing unit 50 generates a fourth biasing current $I_4$ tracking a constant transconductance gm of the CMOS transistors, and the reference voltage $V_{ref}$ is generated based on the fourth biasing current $I_4$. The CMOS transistors comprise PMOS transistors. In other words, the fourth biasing current $I_4$ tracks a constant transconductance gm of the PMOS transistors.

In FIG. 5, the biasing unit 50 comprises a ninth PMOS transistor $M_{P9}$, a tenth PMOS transistor $M_{P10}$, an eleventh PMOS transistor $M_{P11}$, a ninth NMOS transistor $M_{N9}$, a tenth NMOS transistor $M_{N10}$, an eleventh NMOS transistor $M_{N11}$, a fourth resistor $R_4$.

Sources of the ninth, the tenth and the eleventh NMOS transistors $M_{N9}$, $M_{N10}$, $M_{N11}$ are connected to ground. Both a gate and a drain of the ninth NMOS transistor $M_{N9}$ are connected to both a drain of the ninth PMOS transistor $M_{P9}$ and a gate of the tenth NMOS transistor $M_{N10}$. The gate of the tenth NMOS transistor $M_{N10}$ is connected to a gate of the eleventh NMOS transistor $M_{N11}$. A drain of the tenth NMOS transistor $M_{N10}$ is connected to a gate of the ninth PMOS transistor $M_{P9}$ and a drain of the tenth PMOS transistor $M_{P10}$. A drain of the eleventh NMOS transistor $M_{N11}$ is connected to a gate of the tenth PMOS transistor $M_{P10}$ and the fourth resistor $R_4$. The fourth resistor $R_4$ is connected to both a gate and a drain of the eleventh PMOS transistor $M_{P11}$. Sources of the ninth, the tenth and the eleventh PMOS transistors $M_{P9}$, $M_{P10}$, $M_{P11}$ are connected to the power supply Vdd. The drain of the eleventh NMOS transistor $M_{N11}$ is configured to output the fourth biasing current $I_4$. The fourth biasing current $I_4$ tracks a constant transconductance of the tenth PMOS transistor $M_{P10}$.

Note that FIG. 5 is similar to FIG. 2, except that the PMOS transistors and the NMOS transistors are interchanged and the power supply Vdd and the ground (GND) are interchanged.

Using the long-channel approximation, the drain current is proportional to the square of the gate-source voltage, then it can be obtained that $$g_{mP10} = 2 \cdot \left(1 - \frac{1}{\sqrt{N}}\right) \cdot \frac{1}{R_4}$$

In the above expression, the $g_m$ of the PMOS transistor is only relevant to resistance $R_4$ and the ratio N of the size of the two PMOS transistors $M_{P10}$ and $M_{P11}$, and is independent of process and temperature (because the temperature coefficient of the poly resistor $R_4$ is relatively low). When the fourth biasing current $I_4$ is used to bias PMOS transistors, the transconductance is independent of MOS process and temperature.

Alternatively, using the short-channel approximation, as the current is linear to the gate-source voltage, the transconductance can be represented as $$g_{mP10} = \frac{N-1}{N} \cdot \frac{1}{R_4}$$

Similarly, the $g_m$ of the PMOS transistor is only relevant to resistance $R_4$ and the ratio N of the size of the two PMOS transistors $M_{P10}$ and $M_{P11}$, and is independent of process and temperature. When the fourth biasing current $I_4$ is used to bias PMOS transistors, the transconductance is independent of MOS transistor process and temperature.

Figure 6A:
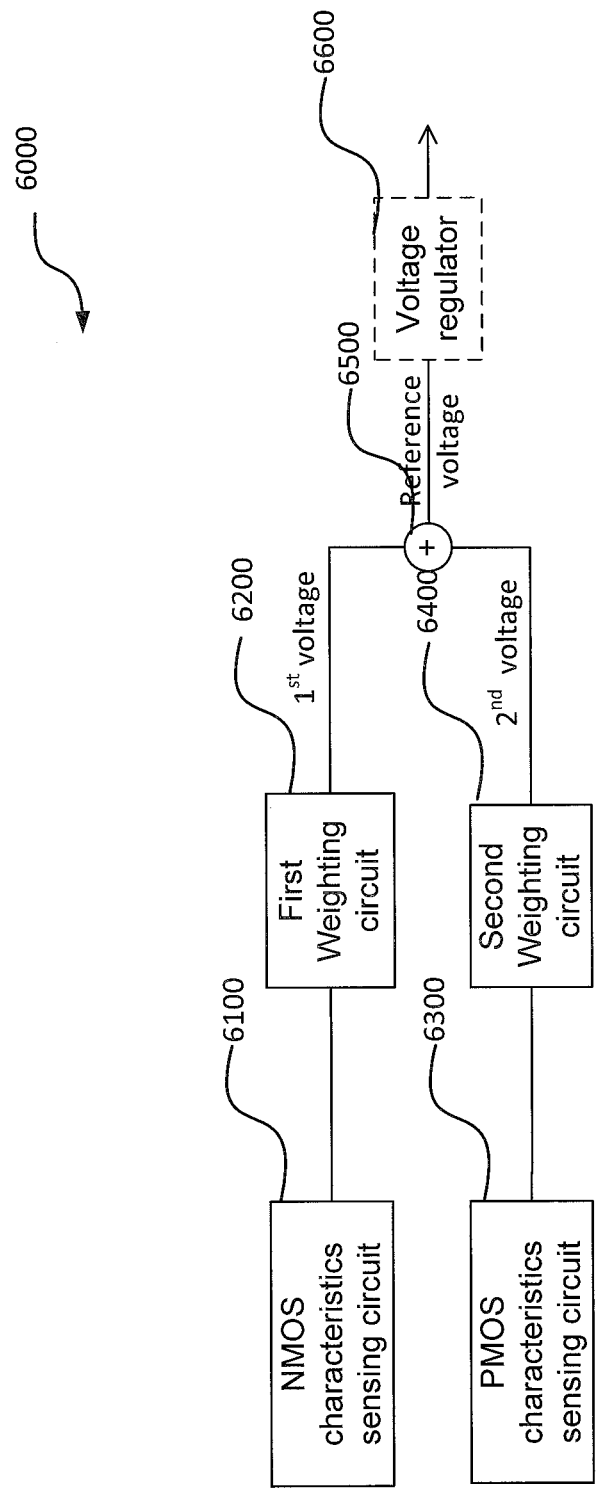
FIG. 6A is a block diagram illustrating an embodiment of a circuit including weighting circuits.

FIG. 6A is a block diagram illustrating an embodiment of a circuit including weighting circuits. As shown in FIG. 6A, the circuit 6000 comprises a NMOS characteristics sensing circuit 6100, a first weighting circuit 6200, a PMOS characteristics sensing circuit 6300, a second weighting circuit 6400, an adder 6500, and a voltage regulator 6600. The NMOS characteristics sensing circuit 6100 detects characteristics of NMOS transistors and generates a first voltage. The first weighting circuit 6200 weighs the first voltage generated by the NMOS characteristics sensing circuit 6100, that means assigning a weighted value to the first voltage. The PMOS characteristics sensing circuit 6300 detects characteristics of PMOS transistors and generates a second voltage. The second weighting circuit 6400 weighs the second voltage generated by the PMOS characteristics sensing circuit 6300, that means assigning a weighted value to the second voltage. The characteristics of the PMOS or NMOS include threshold voltage, mobility, etc. of PMOS or NMOS transistor. The NMOS characteristics sensing circuit 6100 can be implemented by the biasing unit 20 or the biasing unit 30 as discussed above. The PMOS characteristics sensing circuit 6300 can be implemented by the biasing unit 40 or the biasing unit 50 as discussed above. The adder adds the output of the first weighting circuit 6200 and the second weighting circuit 6400. The voltage regulator 6600 receives the outputs of the adder 6500 as a reference voltage, and outputs a voltage signal to a next-stage circuit based on the reference voltage.

In embodiments, the reference voltage is generated by Complementary Metal-Oxide-Semiconductor transistors. As logic gates in digital circuit mostly comprise CMOS transistors, to be specific, NMOS transistors and PMOS transistors, the Complementary Metal-Oxide-Semiconductor transistors in the biasing circuit used to generate reference voltage comprise PMOS transistors and NMOS transistors.

Alternatively, the biasing current comprises a biasing current for the PMOS transistors and a biasing current for the NMOS transistors. A ratio of the biasing current for the PMOS transistors and the biasing current for the NMOS transistor is based on respective sensitivities of delays of digital logic gate affected by PMOS transistor and NMOS transistor.

Alternatively, the sensitivity of the logic gate circuit in response to the NMOS transistors and the sensitivity of the logic gate circuit in response to the PMOS transistors are different, a first weight of the first weighting circuit 6200 and a second weight of the second weighting circuit 6400 may substantially equal to an average sensitivity coefficient.

Alternatively, compensation can be achieved by including only the NMOS characteristics sensing circuit 6100 without the PMOS characteristics sensing circuit 6300, or by including only the PMOS characteristics sensing circuit 6300 without the NMOS characteristics sensing circuit 6100.

Threshold voltage $V_{th}$ and transconductance $g_m$ of MOS transistors vary with process and temperature. When the threshold voltage $V_{th}$ increases or the transconductance $g_m$ decreases (due to possible decease of mobility or due to that the aspect ratio (width-length ratio) W/L is smaller than a target value during manufacturing), delay of the logic gates will increase if a constant voltage reference is used, as the increase of threshold voltage $V_{th}$ will increase the time for the CMOS transistor to reach the threshold voltage, and the decrease of transconductance $g_m$ will also increase the time for the CMOS transistor to reach the threshold voltage.

In the embodiments of the invention, MOS transistors are used to form a biasing unit that generates a reference voltage. When the gate-source voltage $V_{GS}$ of MOS transistors increases, the power supply of the logic gates also increases, therefore the delay time of the logic gates will decrease, which compensates for the influence of the increase of threshold voltage $V_{th}$ or decrease of transconductance $g_m$. On the other hand, when the gate-source voltage $V_{GS}$ of MOS transistors decreases, the power supply of the logic gates also decreases, therefore the delay time of the logic gates will increase, which compensates for the influence of the decrease of threshold voltage $V_{th}$ or increase of transconductance $g_m$. In this way the sensitivity of the delay time of logic gates in response to process and temperature are decreased.

To be more specific, the speed of the logic gates is determined by drive and load. The drive capability is mainly determined by the threshold voltage $V_{th}$ and transconductance $g_m$ of the MOS transistors. Both the threshold voltage $V_{th}$ and transconductance $g_m$ of the MOS transistor are sensitive to process and temperature. Load comprises capacitive gate load and wire capacitance. In deep submicron technology, the wire capacitance dominates. As the wire capacitance is a passive device, it is less sensitive to process and temperature. Above embodiments compensate for the drive capability, that is the threshold voltage $V_{th}$ and transconductance $g_m$ of the MOS transistor, so as to reduce the speed variation of the logic gates.

Figure 6B:
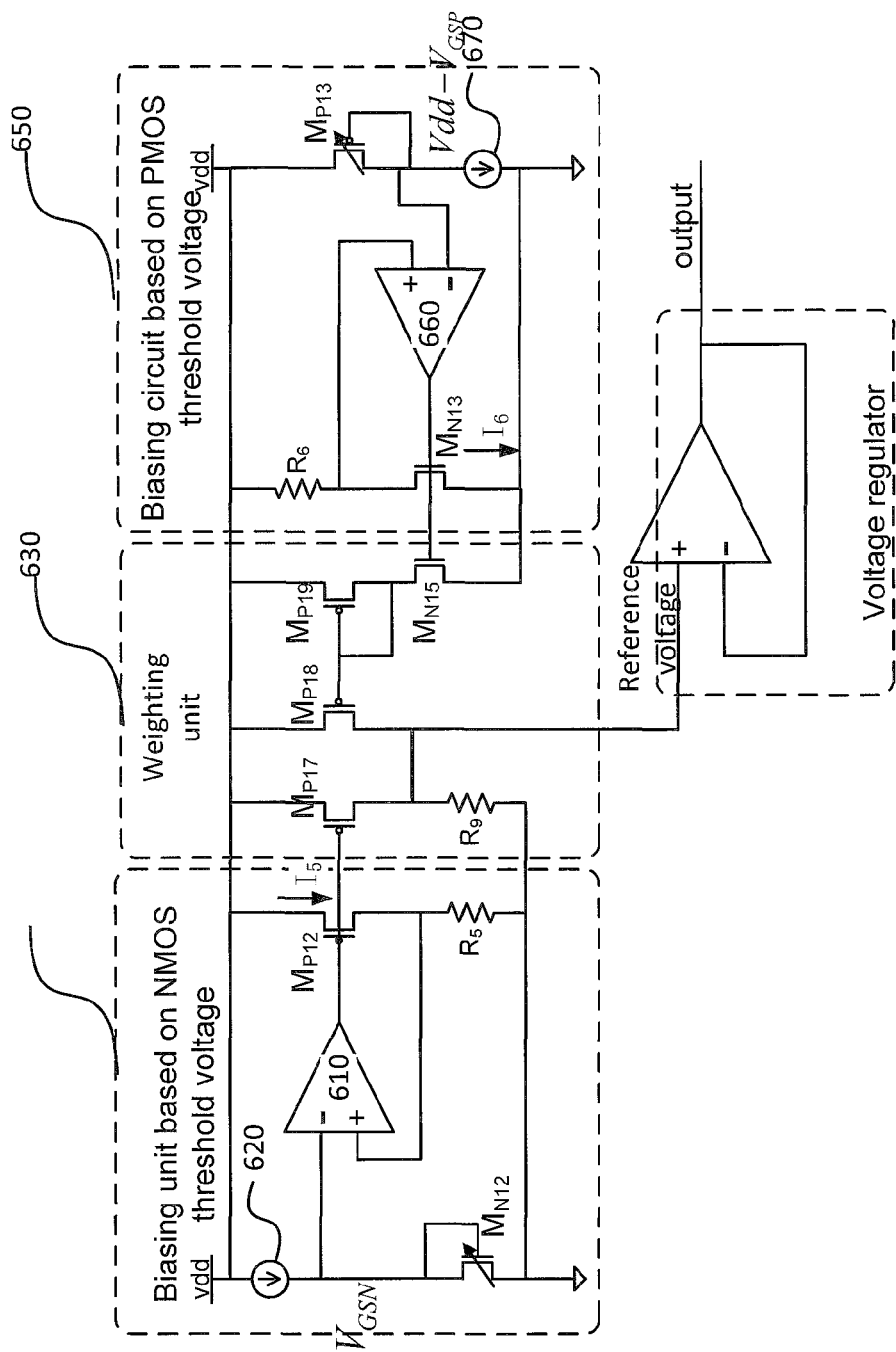
FIG. 6B is a diagram illustrating another embodiment of the circuit.

FIG. 6B is a diagram illustrating another embodiment of the circuit. The CMOS transistor comprises a NMOS transistor. In other words, the biasing unit 600 generates a fifth biasing current $I_5$ tracking a threshold voltage $V_{th}$ of the NMOS transistors, and the reference voltage $V_{ref}$ is generated based on the fifth biasing current $I_5$. The biasing unit 600 comprises a twelfth NMOS transistor $M_{N12}$, a second amplifier 610, a first current source 620, a twelfth PMOS transistor $M_{P12}$, a fifth resistor $R_5$.

The first current source 620 is connected to a power supply Vdd. A drain of the twelfth NMOS transistor $M_{N12}$ is connected to both the first current source 620 and a negative input of the second amplifier 610. A source of the twelfth NMOS transistor $M_{N12}$ is connected to both ground and the fifth resistor $R_5$. The fifth resistor $R_5$ is connected to both a positive input of the second amplifier 610 and a drain of the twelfth PMOS transistor $M_{P12}$. A gate of the twelfth PMOS transistor $M_{P12}$ is connected to an output of the second amplifier 610. A source of the twelfth PMOS transistor $M_{P12}$ is connected to the power supply Vdd. The drain of the twelfth PMOS transistor $M_{P12}$ outputs the fifth biasing current $I_5$.

Alternatively or in addition, the CMOS transistors comprises a PMOS transistor, wherein the biasing unit 650 comprises a thirteenth NMOS transistor $M_{N13}$, a third amplifier 660, a second current source 670, a thirteenth PMOS transistor $M_{P13}$, a sixth resistor $R_6$.

The second current source 670 is connected to ground. A drain of the thirteenth PMOS transistor $M_{P13}$ is connected to both the second current source 670 and a negative input of the third amplifier 660. A source of the thirteenth PMOS transistor $M_{P13}$ is connected to the power supply Vdd. The sixth resistor $R_6$ is connected to both a positive input of the third amplifier 660 and a drain of the thirteenth NMOS transistor $M_{N13}$. A gate of the thirteenth NMOS transistor $M_{N13}$ is connected to an output of the third amplifier 660. A source of the thirteenth NMOS transistor $M_{N13}$ is connected to ground. The drain of the thirteenth NMOS transistor $M_{N13}$ outputs a sixth biasing current $I_6$.

FIG. 6B further shows a weighting unit 630. The weighting unit 630 comprises a seventeenth PMOS transistor $M_{P17}$, an eighteenth PMOS transistor $M_{P18}$, a nineteenth PMOS transistor $M_{P19}$, a fifteenth NMOS transistor $M_{N15}$ and a ninth resistor $R_9$. A gate of the seventeenth PMOS transistor $M_{P17}$ is connected to the gate of the twelfth PMOS transistor $M_{P12}$. A drain of the seventeenth PMOS transistor $M_{P17}$ is connected to both a drain of the eighteenth PMOS transistor $M_{P18}$ and the ninth resistor $R_9$. A gate of the eighteenth PMOS transistor $M_{P18}$ is connected to both a gate and a drain of the nineteenth PMOS transistor $M_{P19}$ and a drain of the fifteenth NMOS transistor $M_{N15}$. A gate of the fifteenth NMOS transistor $M_{N15}$ is connected to the gate of the thirteenth NMOS transistor $M_{N13}$. Source of the fifteenth NMOS $M_{N15}$ is connected to ground. Sources of all of the seventeenth PMOS transistor $M_{P17}$, the eighteenth PMOS transistor $M_{P18}$ and the nineteenth PMOS transistor $M_{P19}$ are connected to the power source Vdd. The twelfth PMOS transistor $M_{P12}$ and the seventeenth PMOS transistor $M_{P17}$ form a current mirror, and the eighteenth PMOS transistor $M_{P18}$ and the nineteenth PMOS transistor $M_{P19}$ form a current mirror. The fifteenth NMOS transistor $M_{N15}$ and the thirteenth NMOS transistor $M_{N13}$ form a current mirror. By chosen the size (for example, aspect ratio) of these CMOSs, the current that passes through the ninth resistor $R_9$ can be a combination of the $I_5$ and $I_6$. For example, $$V\text{out} = (I_5 + I_6) \times R_9 = \left(\frac{V_{GSN}}{R_5} + \frac{V_{GSP}}{R_6}\right) \times R_9.$$

Figure 7:
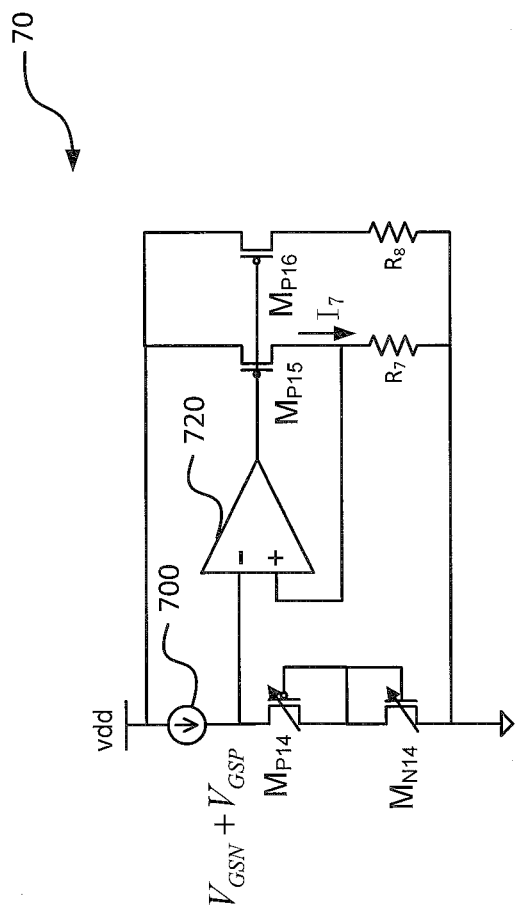
FIG. 7 is a diagram illustrating another embodiment of the circuit.

FIG. 7 is a diagram illustrating another embodiment of the circuit. The biasing unit 70 generates a seventh biasing current $I_7$ tracking a threshold voltage $V_{th}$ of both a NMOS transistor and a CMOS transistor.

The biasing unit 70 comprises a fourteenth NMOS transistor $M_{N14}$, a fourteenth PMOS transistor $M_{P14}$, a third current source 700, a fourth amplifier 720, a fifteenth PMOS transistor $M_{P15}$, a sixteenth PMOS transistor $M_{P16}$, a seventh resistor $R_7$, an eighth resistor $R_8$.

The third current source 700 is connected to the power supply Vdd. A source of the fourteenth PMOS transistor $M_{P14}$ is connected to both the third current source 700 and a negative input of the fourth amplifier 720. A drain of the fourteenth PMOS transistor $M_{P14}$ is connected to both a gate of the fourteenth PMOS transistor $M_{P14}$ and a drain and a gate of the fourteenth NMOS transistor $M_{N14}$. A source of the fourteenth NMOS transistor $M_{N14}$ is connected to ground. The seventh resistor $R_7$ is connected to both a positive input of the fourth amplifier 720 and a drain of the fifteenth PMOS transistor $M_{P15}$. A gate of the fifteenth PMOS transistor $M_{P15}$ is connected to an output of the fourth amplifier 720, and a source of the fifteenth PMOS transistor $M_{P16}$ is connected to the power supply Vdd. A gate of the sixteenth PMOS transistor $M_{P16}$ is connected to the gate of the fifteenth PMOS transistor $M_{P15}$, a source of the sixteenth PMOS transistor $M_{P16}$ is connected to the power supply vdd. A drain of the sixteenth PMOS transistor $M_{P16}$ is connected to ground via the eighth resistor $R_8$. The drain of the fifteenth PMOS transistor $M_{P15}$ outputs the seventh current $I_7$. The drain of the sixteenth PMOS transistor $M_{P16}$ outputs the reference voltage. To be specific, as the fifteenth PMOS transistor $M_{P16}$ and sixteenth PMOS transistor $M_{P16}$ form a current mirror, the current passing through the sixteenth PMOS transistor $M_{P16}$ is proportional to the current $I_7$ passing through the fifteenth PMOS transistor $M_{P15}$. Therefore, $$V\text{out} = (V_{GSN} + V_{GSP}) \times \frac{R_8}{R_7}.$$

In FIG. 7, the weighting between $V_{GSN}$ and $V_{GSP}$ cannot be adjusted. As the fourteenth NMOS transistor $M_{N14}$ is connected to directly to the fourteenth PMOS transistor $M_{P14}$, the weight of their threshold voltage cannot be adjusted. By changing the size of the transistors or changing the biasing current, the temperature coefficient can be adjusted. By changing the ratio between $R_7$ and $R_8$, the value of reference voltage can be adjusted.

Figure 8:
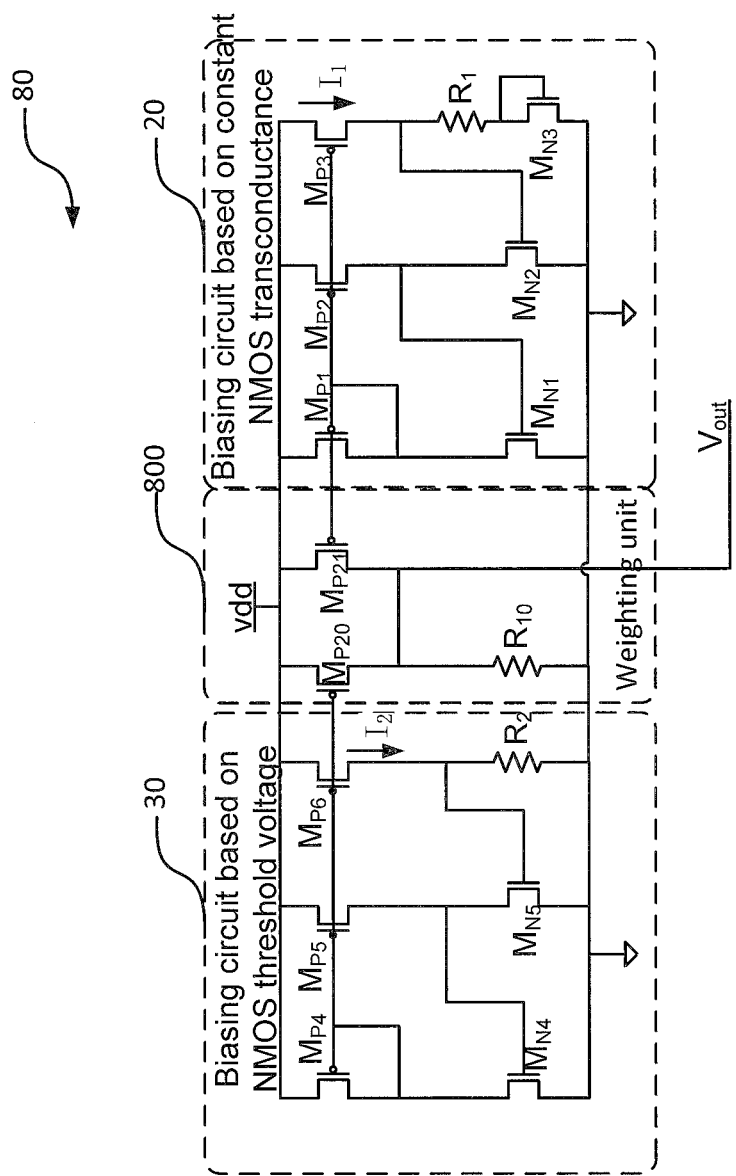
FIG. 8 is a diagram illustrating another embodiment of the biasing unit.

FIG. 8 is a diagram illustrating another embodiment of the biasing unit. In the circuit 80 shown in FIG. 8, the biasing unit 20 and the biasing unit 30 can be combined using a weighting unit 800. Details are omitted for elements already described with respect to FIG. 2 and FIG. 3. The weighting unit 800 comprises a twentieth PMOS transistor $M_{P20}$, a twenty-first PMOS transistor $M_{P21}$ and a tenth resistor $R_{10}$. A gate of the twentieth PMOS transistor $M_{P20}$ is connected to the gate of the sixth PMOS transistor $M_{P6}$. A drain of the twentieth PMOS transistor $M_{P20}$ is connected to both a drain of the twenty-first PMOS transistor $M_{P21}$ and the tenth resistor $R_{10}$. A gate of the twenty-first PMOS transistor $M_{P21}$ is connected to both a gate and a drain of the first PMOS transistor $M_{P1}$ and a drain of the first NMOS transistor $M_{N1}$. The first PMOS transistor $M_{P1}$, third PMOS transistor $M_{P3}$ and the second PMOS transistor $M_{P2}$ form a current mirror, and the first PMOS transistor $M_{P1}$ and the twenty-first PMOS transistor $M_{P21}$ form a current mirror. The twentieth PMOS transistor $M_{P20}$ and the sixth PMOS transistor $M_{P6}$ form a current mirror. Therefore, the current passes through the tenth resistor $R_{10}$ equals the sum of the $I_1$ and $I_2$. In other words, the output voltage can be expressed as:

$$V_{out} = \left(\frac{V_{TN5}}{R_2} + \frac{\Delta V_{GSN}}{R_1}\right) \cdot R_{10}$$

If $R_{10}$ equals $R_2$, the above expression can be simplified to $$V_{out} = V_{TN5} + \frac{\Delta V_{GSN} \cdot R_{10}}{R_1},$$

that is, the output voltage equals a sum of the $V_{TN5}$ and a component that can generate constant $g_m$. When the voltage Vout is applied to logic gates, and the NMOS is switched on, its transconductance is constant, which is independent of process or temperature. (because $\Delta V_{GSN}$ is relative to resistor)

The above analysis is based on the assumption that the NMOS operates in a saturation region. When the input of the logic gates experiences transition, for example, an input of the CMOS inverter changes from logic low "0" to logic high "1," the NMOS transistors inside the inverter first operates in a saturation region, with a delay time constant τ proportional to $g_m/C_l$, where $C_l$ represents a load capacitor. At last, when the NMOS transistor operates in the linear region, the delay time (if any) is proportional to $1/(RC_l)$, wherein R is the resistance of the NMOS in the linear region. The resistance of the NMOS transistor in the linear region approximates to the transconductance in saturation region. Therefore the conduct in the initial and ending phase of the rising edge is controllable and much less sensitive to process and temperature than conventional circuits.

Alternatively, the ratio of the first biasing current $I_1$ and the second biasing current $I_2$ is adjustable.

Figure 9:
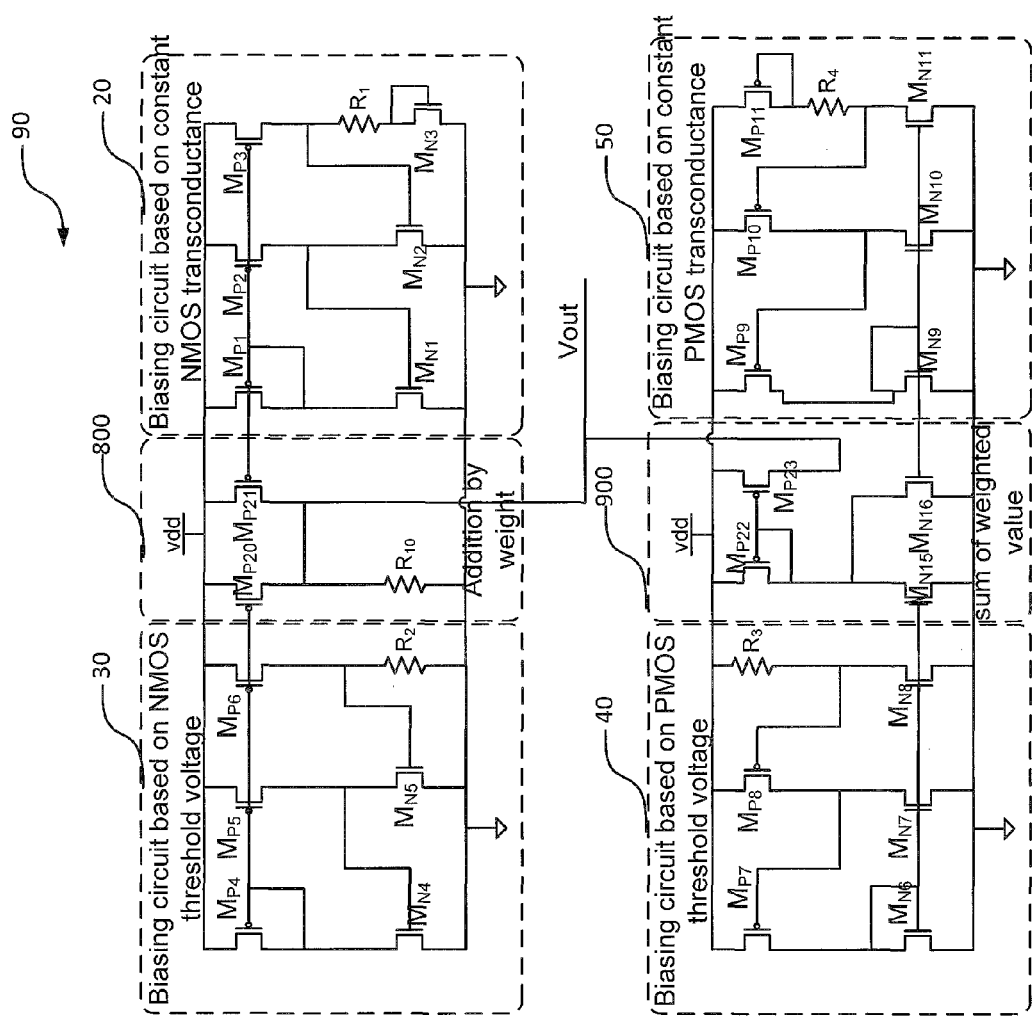
FIG. 9 is a diagram illustrating another embodiment of the biasing unit.

FIG. 9 is a diagram illustrating another embodiment of the circuit. In the circuit 90 shown in FIG. 9, the biasing unit 20 and the biasing unit 30 can be combined using a weighting unit 800, and the biasing unit 40 and the biasing unit 50 can be combined using a weighting unit 900. Details are omitted for elements already described with respect to FIG. 2, FIG. 3, FIG. 4, FIG. 5 and FIG. 8. The output voltage can be represented as $$V_{out} = \left(\frac{V_{TN5}}{R_2} + \frac{\Delta V_{GSN}}{R_1} + \frac{V_{TP8}}{R_3} + \frac{\Delta V_{GSP}}{R_4}\right) \cdot R_{10}$$

Wherein the weighting coefficient can be set by $R_1$, $R_2$, $R_3$ and $R_4$, while $R_{10}$ determines the multiple factor. The weighting coefficient can be adjusted according to simulation result, so as to reduce the delay variation of the logic gates.

Figure 10:
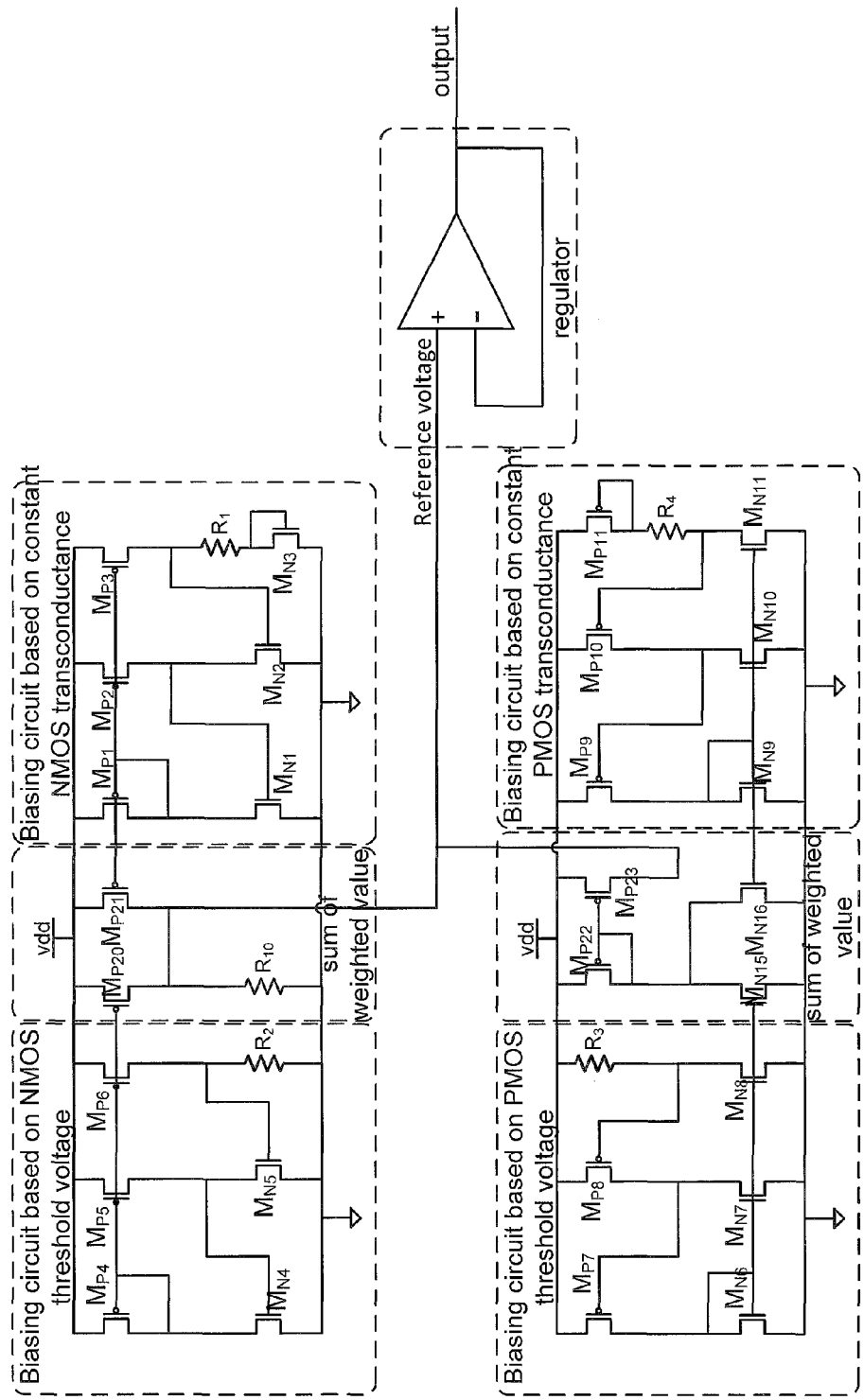
FIG. 10 is a diagram illustrating another embodiment of the circuit.

FIG. 10 is a diagram illustrating another embodiment of the circuit. Details are omitted for elements already described with respect to FIG. 10. With the structure shown in FIG. 10, the voltage regulator outputs a voltage signal with low impedance that can compensate for the variation of delay for the logic gates. Details are omitted for elements already described with respect to FIG. 9.

Figure 11:
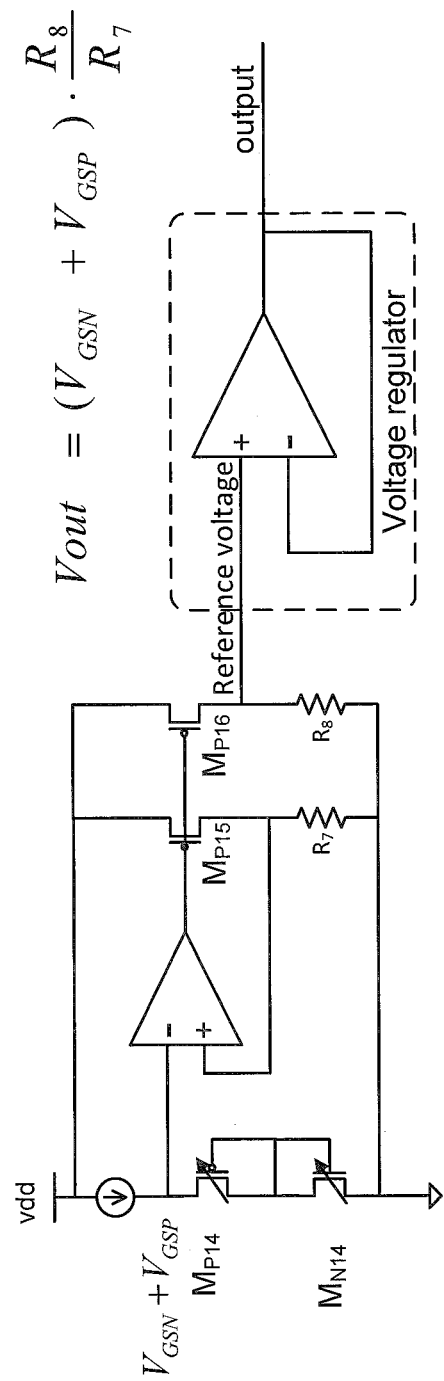
FIG. 11 is a diagram illustrating another embodiment of the biasing unit.

FIG. 11 is a diagram illustrating another embodiment of the circuit. FIG. 11 further shows the voltage regulator that receives the reference voltage outputted by the drain of the sixteenth PMOS transistor $M_{P16}$. Details are omitted for elements already described with respect to FIG. 7.

Figure 12:
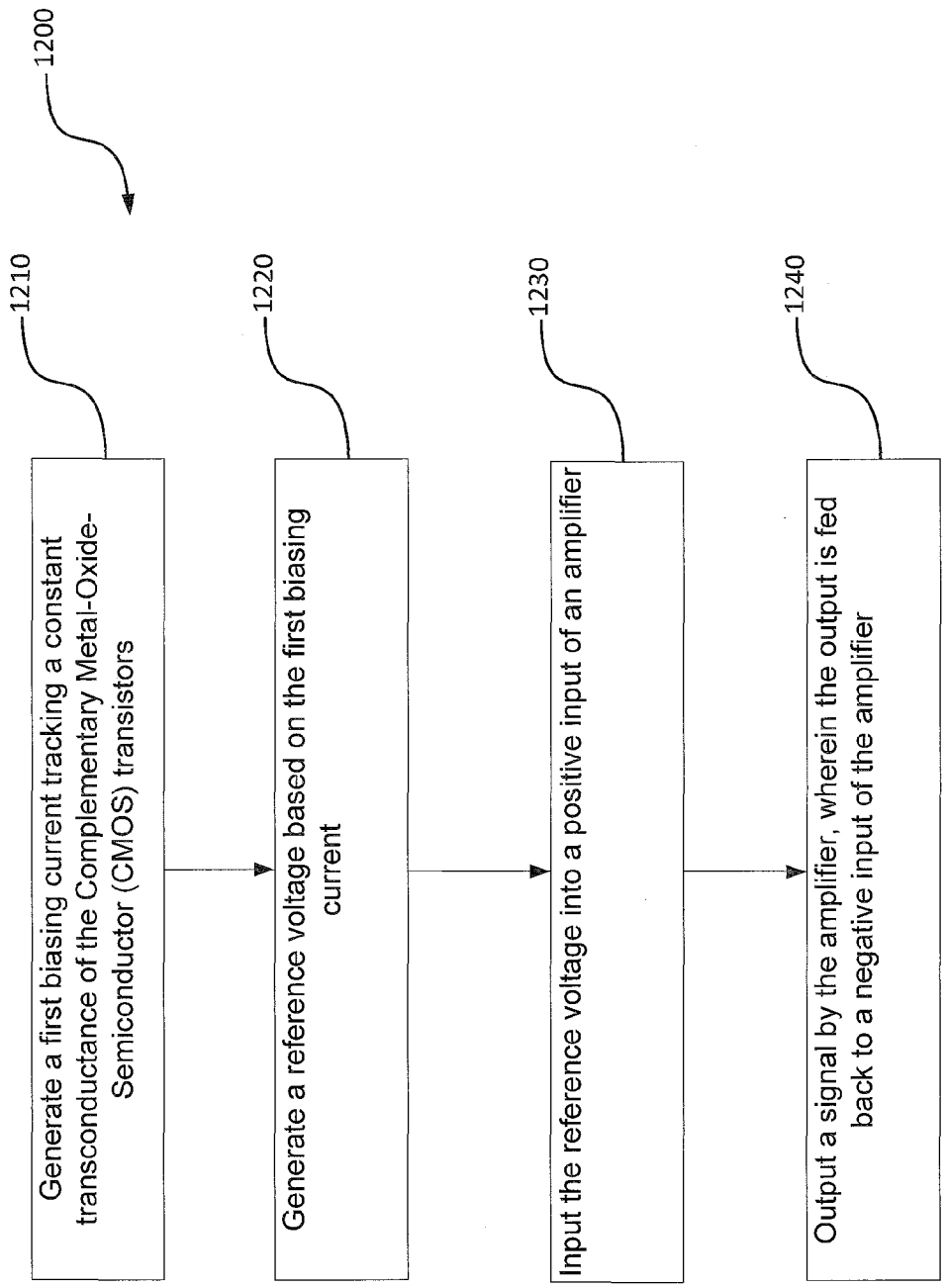
FIG. 12 is a flow chart illustrating a method of an embodiment.

FIG. 12 is a flow chart illustrating a method of an embodiment. The method 1200 comprises generating (in block 1210) a first biasing current, the first biasing current flows through a Complementary Metal-Oxide-Semiconductor (CMOS) transistor, such that a transconductance of the CMOS transistors is constant; generating (in block 1220) a reference voltage based on the first biasing current; inputting (in block 1230) the reference voltage into a positive input of an amplifier; and outputting (in block 1240) a signal by the amplifier, wherein the output is fed back to a negative input of the amplifier.

Alternatively, the CMOS transistors comprise NMOS transistors, wherein the biasing unit comprises a first PMOS transistor $M_{P1}$, a second PMOS transistor $M_{P2}$, a third PMOS transistor $M_{P3}$, a first NMOS transistor $M_{N1}$, a second NMOS transistor $M_{N2}$, a third NMOS transistor $M_{N3}$, and a first resistor $R_1$. Sources of the first, the second and the third PMOS transistors $M_{P1}$, $M_{P2}$, $M_{P3}$ are connected to a power supply Vdd. Both a gate and a drain of the first PMOS $M_{P1}$ transistor are connected to a drain of the first NMOS transistor $M_{N1}$. A gate of the second PMOS transistor $M_{P2}$ is connected to gates of both the first PMOS transistor $M_{P1}$ and the third PMOS transistor $M_{P3}$. A drain of the second PMOS transistor $M_{P2}$ is connected to both a gate of the first NMOS transistor $M_{N1}$ and a drain of the second NMOS transistor $M_{N2}$. A drain of the third PMOS transistor $M_{P3}$ is connected to a gate of the second NMOS transistor $M_{N2}$ and the first resistor $R_1$. The first resistor $R_1$ is connected to both a gate and a drain of the third NMOS transistor $M_{N3}$. Sources of the first, the second and the third NMOS transistors $M_{N1}$, $M_{N2}$, $M_{N3}$ are connected to ground. The drain of the third PMOS transistor $M_{P3}$ is configured to output the first biasing current $I_1$.

Alternatively, the CMOS transistors comprise PMOS transistors, wherein the biasing unit comprises a ninth PMOS transistor $M_{P9}$, a tenth PMOS transistor $M_{P10}$, an eleventh PMOS transistor $M_{P11}$, a ninth NMOS transistor $M_{N9}$, a tenth NMOS transistor $M_{N10}$, an eleventh NMOS transistor $M_{N11}$, and a fourth resistor $R_4$.

Sources of the ninth, the tenth and the eleventh NMOS transistors $M_{N9}$, $M_{N10}$, $M_{N11}$ are connected to ground. Both a gate and a drain of the ninth NMOS transistor $M_{N9}$ are connected to both a drain of the ninth PMOS transistor $M_{P9}$ and a gate of the tenth NMOS transistor $M_{N10}$. The gate of the tenth NMOS transistor $M_{N10}$ is connected to a gate of the eleventh NMOS transistor $M_{N11}$. A drain of the tenth NMOS transistor $M_{N10}$ is connected to a gate of the ninth PMOS transistor $M_{P9}$ and a drain of the tenth PMOS transistor $M_{P10}$. A drain of the eleventh NMOS transistor $M_{N11}$ is connected to a gate of the tenth PMOS transistor $M_{P10}$ and the fourth resistor $R_4$. The fourth resistor $R_4$ is connected to both a gate and a drain of the eleventh PMOS transistor $M_{P11}$. Sources of the ninth, the tenth and the eleventh PMOS transistors $M_{P9}$, $M_{P10}$, $M_{P11}$ are connected to the power supply. The drain of the eleventh NMOS transistor $M_{N11}$ is configured to output the fourth biasing current $I_4$.

Figure 13:
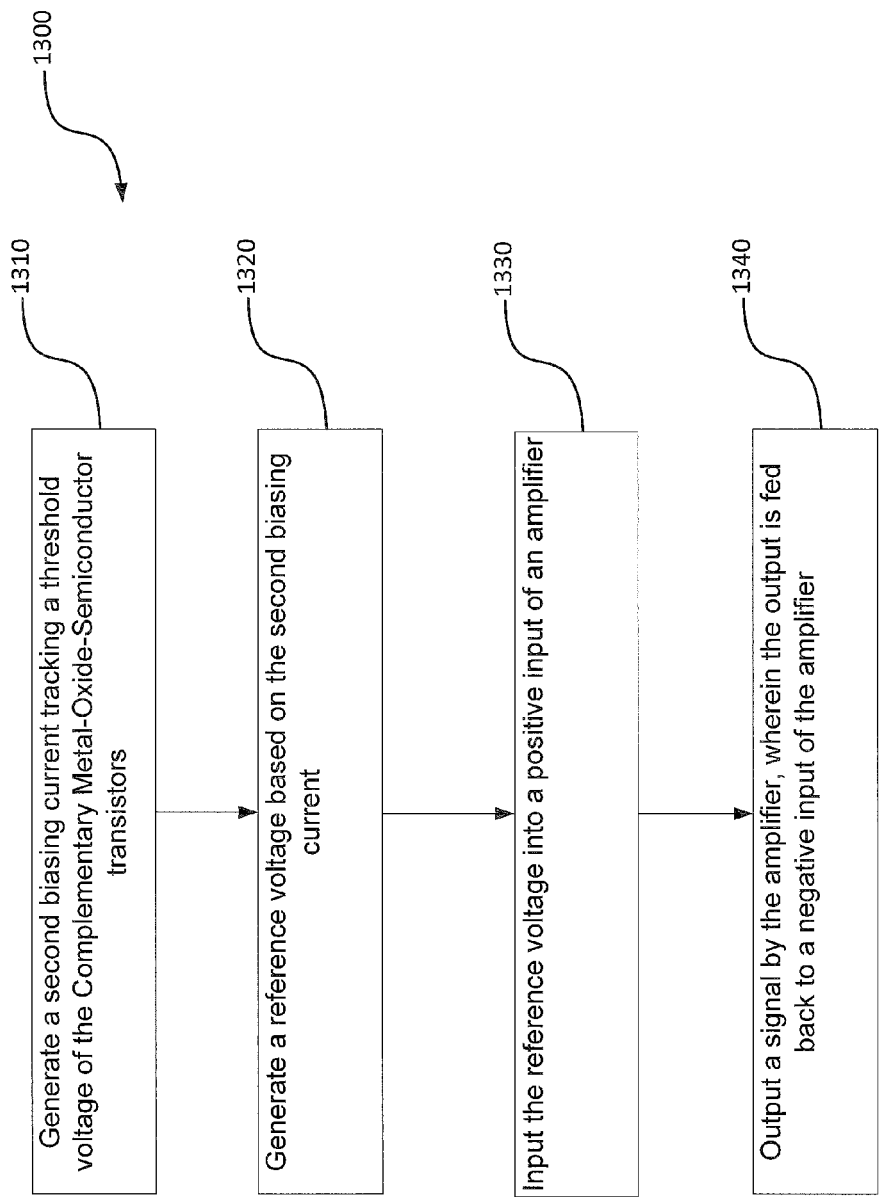
FIG. 13 is a flow chart illustrating a method of an embodiment.

FIG. 13 is a flow chart illustrating a method of an embodiment. The method 1300 comprises generating (in block 1310) a second biasing current tracking a threshold voltage of the Complementary Metal-Oxide-Semiconductor transistors; generating (in block 1320) a reference voltage based on the second biasing current; inputting (in block 1330) the reference voltage into a positive input of an amplifier; and outputting (in block 1340) a signal by the amplifier, wherein the output is fed back to a negative input of the amplifier.

Alternatively, the CMOS transistors comprise NMOS transistors, and the biasing unit comprises a fourth PMOS transistor $M_{P4}$, a fifth PMOS transistor $M_{P5}$, a sixth PMOS transistor $M_{P6}$, a fourth NMOS transistor $M_{N4}$, a fifth NMOS transistor $M_{N5}$, and a second resistor $R_2$.

Sources of the fourth, the fifth and the sixth PMOS transistors $M_{P4}$, $M_{P5}$, $M_{P6}$ are connected to a power supply Vdd. Both a gate and a drain of the fourth PMOS $M_{P4}$ transistor are connected to a drain of the fourth NMOS transistor $M_{N4}$. A gate of the fifth PMOS transistor $M_{P5}$ is connected to gates of both the fourth PMOS transistor and the sixth PMOS transistor $M_{P6}$. A drain of the fifth PMOS transistor $M_{P5}$ is connected to both a gate of the fourth NMOS transistor $M_{N4}$ and a drain of the fifth NMOS transistor $M_{N5}$. A drain of the sixth PMOS transistor $M_{P6}$ is connected to a gate of the fifth NMOS transistor $M_{N5}$ and the second resistor $R_2$. Sources of the fourth, the fifth NMOS transistors $M_{N4}$, $M_{N5}$ are connected to ground. The drain of the sixth PMOS transistor $M_{P6}$ is configured to output the second biasing current $I_2$.

Alternatively, the CMOS transistors comprise PMOS transistors. In other words, a third biasing current $I_3$ tracks a threshold voltage $V_{th}$ of the PMOS transistors. The biasing unit comprises a sixth NMOS transistor $M_{N6}$, a seventh NMOS transistor $M_{N7}$, an eighth NMOS transistor $M_{N8}$, a seventh PMOS transistor $M_{P7}$, an eighth PMOS transistor $M_{P8}$, and a third resistor $R_3$.

Sources of the sixth, the seventh and the eighth NMOS transistors $M_{N6}$, $M_{N7}$, $M_{N8}$ are connected to ground GND. Both a gate and a drain of the sixth NMOS transistor $M_{N6}$ are connected to both a drain of the seventh PMOS $M_{P7}$ and a gate of the seventh NMOS transistor $M_{N7}$. The gate of the seventh NMOS transistor $M_{N7}$ is connected to a gate of the eighth NMOS transistor $M_{N8}$. A drain of the seventh NMOS transistor $M_{N7}$ is connected to a gate of the seventh PMOS transistor $M_{P7}$ and a drain of the eighth PMOS transistor $M_{P8}$. A drain of the eighth NMOS transistor $M_{N8}$ is connected to a gate of the eighth PMOS transistor $M_{P8}$ and the third resistor $R_3$. Sources of the seventh and the eighth PMOS transistors $M_{P7}$, $M_{P8}$ are connected to the power supply Vdd. The drain of the eighth NMOS transistor $M_{N8}$ is configured to output the third biasing current $I_3$. $I_3$ tracks a threshold voltage the PMOS transistor $M_{P8}$.

Alternatively, the CMOS transistors comprises a NMOS transistor, wherein the biasing unit comprises a twelfth NMOS transistor $M_{N12}$, a second amplifier 610, a first current source 620, a twelfth PMOS transistor $M_{P12}$, a fifth resistor $R_5$.

The first current source 620 is connected to a power supply Vdd. A drain of the twelfth NMOS transistor $M_{N12}$ is connected to both the first current source 620 and a negative input of the second amplifier 610. A source of the twelfth NMOS transistor $M_{N12}$ is connected to both ground and the fifth resistor $R_5$. The fifth resistor $R_5$ is connected to both a positive input of the second amplifier 610 and a drain of the twelfth PMOS transistor $M_{P12}$. A gate of the twelfth PMOS transistor $M_{P12}$ is connected to an output of the second amplifier 610. A source of the twelfth PMOS transistor $M_{P12}$ is connected to the power supply Vdd. The drain of the twelfth PMOS transistor $M_{P12}$ outputs the fifth biasing current $I_5$.

Alternatively, the CMOS transistors comprises a PMOS transistor, wherein the biasing unit comprises a thirteenth NMOS transistor $M_{N13}$, a third amplifier 660, a second current source 670, a thirteenth PMOS transistor $M_{P13}$, a sixth resistor $R_6$.

The second current source 670 is connected to ground. A drain of the thirteenth PMOS transistor $M_{P13}$ is connected to both the second current source 670 and a negative input of the third amplifier 660. A source of the thirteenth PMOS transistor $M_{P13}$ is connected to the power supply Vdd. The sixth resistor $R_6$ is connected to both a positive input of the third amplifier 660 and a drain of the thirteenth NMOS transistor $M_{N13}$. A gate of the thirteenth NMOS transistor $M_{N13}$ is connected to an output of the third amplifier 660. A source of the thirteenth NMOS transistor $M_{N13}$ is connected to ground. The drain of the thirteenth NMOS transistor $M_{N13}$ outputs the sixth biasing current $I_6$.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

From the foregoing, it will be appreciated that specific embodiments of the invention have been described herein for purposes of illustration, but that various modifications may be made without deviating from the scope of the invention. Accordingly, the invention is not limited except as by the appended claims.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Even if certain features are recited in different dependent claims, the present invention also relates to an embodiment comprising these features in common. Any reference signs in the claims should not be construed as limiting the scope.

Features and aspects of various embodiments may be integrated into other embodiments, and embodiments illustrated in this document may be implemented without all of the features or aspects illustrated or described. One skilled in the art will appreciate that although specific examples and embodiments of the system and methods have been described for purposes of illustration, various modifications can be made without deviating from the spirit and scope of the present invention. Moreover, features of one embodiment may be incorporated into other embodiments, even where those features are not described together in a single embodiment within the present document. Accordingly, the invention is described by the appended claims.

We claim:

1. A circuit comprising:
    a first amplifier having a positive input, a negative input and an output, wherein the output of the first amplifier is connected to the negative input;
    a biasing unit configured to generate a reference voltage with Complementary Metal-Oxide-Semiconductor (CMOS) transistors, wherein the positive input of the first amplifier is configured to receive the reference voltage;
    wherein the biasing unit is configured to generate a second biasing current tracking a threshold voltage of the CMOS transistors, and the reference voltage is generated based on the second biasing current.

2. The circuit of claim 1, wherein the biasing unit is configured to generate a first biasing current, wherein the first biasing current flows through the CMOS transistor, such that a transconductance of the CMOS transistors is constant, and the reference voltage is generated based on the first biasing current.

3. The circuit of claim 2, wherein the CMOS transistors include NMOS transistors, wherein the biasing unit comprises a first PMOS transistor, a second PMOS transistor, a third PMOS transistor, a first NMOS transistor, a second NMOS transistor, a third NMOS transistor, and a first resistor, wherein
    sources of the first, the second and the third PMOS transistors are connected to a power supply;
    both a gate and a drain of the first PMOS transistor are connected to a drain of the first NMOS transistor;
    a gate of the second PMOS transistor is connected to gates of both the first PMOS transistor and the third PMOS transistor;
    a drain of the second PMOS transistor is connected to both a gate of the first NMOS transistor and a drain of the second NMOS transistor;
    a drain of the third PMOS transistor is connected to a gate of the second NMOS transistor and the first resistor;
    the first resistor is connected to both a gate and a drain of the third NMOS transistor; and
    sources of the first, the second and the third NMOS transistors are connected to ground; wherein the drain of the third PMOS transistor is configured to output the first biasing current.

4. The circuit of claim 1, wherein the CMOS transistors include NMOS transistors, and the biasing unit comprises a fourth PMOS transistor, a fifth PMOS transistor, a sixth PMOS transistor, a fourth NMOS transistor, a fifth NMOS transistor, and a second resistor, wherein
    sources of the fourth, the fifth and the sixth PMOS transistors are connected to a power supply;
    both a gate and a drain of the fourth PMOS transistor are connected to a drain of the fourth NMOS transistor;
    a gate of the fifth PMOS transistor is connected to gates of both the fourth PMOS transistor and the sixth PMOS transistor;
    a drain of the fifth PMOS transistor is connected to a gate of the fourth NMOS transistor and a drain of the fifth NMOS transistor;
    a drain of the sixth PMOS transistor is connected to a gate of the fifth NMOS transistor and the second resistor; and sources of the fourth and the fifth NMOS transistors are connected to ground; wherein the drain of the sixth PMOS transistor is configured to output the second biasing current.

5. The circuit of claim 1, wherein the CMOS transistors include PMOS transistors, wherein the biasing unit comprises a sixth NMOS transistor, a seventh NMOS transistor, an eighth NMOS transistor, a seventh PMOS transistor, an eighth PMOS transistor, and a third resistor, wherein
sources of the sixth, the seventh and the eighth NMOS transistors are connected to ground;
both a gate and a drain of the sixth NMOS transistor are connected to both a drain of the seventh PMOS and a gate of the seventh NMOS transistor;
the gate of the seventh NMOS transistor is connected to a gate of the eighth NMOS transistor;
a drain of the seventh NMOS transistor is connected to a gate of the seventh PMOS transistor and a drain of the eighth PMOS transistor;
a drain of the eighth NMOS transistor is connected to a gate of the eighth PMOS transistor and the third resistor; and
sources of the seventh and the eighth PMOS transistors are connected to the power supply; wherein the drain of the eighth NMOS transistor is configured to output the second biasing current.

6. The circuit of claim 2, wherein the CMOS transistors include PMOS transistors, wherein the biasing unit comprises a ninth PMOS transistor, a tenth PMOS transistor, an eleventh PMOS transistor, a ninth NMOS transistor, a tenth NMOS transistor, an eleventh NMOS transistor, a fourth resistor, wherein
sources of the ninth, the tenth and the eleventh NMOS transistors are connected to ground;
both a gate and a drain of the ninth NMOS transistor are connected to both a drain of the ninth PMOS transistor and a gate of the tenth NMOS;
the gate of the tenth NMOS transistor is connected to a gate of the eleventh NMOS transistor;
a drain of the tenth NMOS transistor is connected to a gate of the ninth PMOS transistor and a drain of the tenth PMOS transistor;
a drain of the eleventh NMOS transistor is connected to a gate of the tenth PMOS transistor and the fourth resistor;
the fourth resistor is connected to both a gate and a drain of the eleventh PMOS transistor; and
sources of the ninth, the tenth and the eleventh PMOS transistors are connected to the power supply; wherein the drain of the eleventh NMOS transistor is configured to output the first biasing current.

7. The circuit of claim 1, wherein the CMOS transistors include a NMOS transistor, wherein the biasing unit comprises a twelfth NMOS transistor, a second amplifier, a first current source, a twelfth PMOS transistor and a fifth resistor, wherein
the first current source is connected to a power supply, a drain of the twelfth NMOS transistor is connected to both the first current source and a negative input of the second amplifier, a source of the twelfth NMOS transistor is connected to both ground and the fifth resistor, the fifth resistor is connected to both a positive input of the second amplifier and a drain of the twelfth PMOS transistor, a gate of the twelfth PMOS transistor is connected to an output of the second amplifier, and a source of the twelfth PMOS transistor is connected to the power supply, wherein the drain of the twelfth PMOS transistor outputs the second biasing current.

8. The circuit of claim 1, wherein the CMOS transistors include a PMOS transistor, wherein the biasing unit comprises a thirteenth NMOS transistor, a third amplifier, a second current source, a thirteenth PMOS transistor and a sixth resistor, wherein
the second current source is connected to ground, a drain of the thirteenth PMOS transistor is connected to both the second current source and a negative input of the third amplifier, a source of the thirteenth PMOS transistor is connected to the power supply, the sixth resistor is connected to both a positive input of the third amplifier and a drain of the thirteenth PMOS transistor, a gate of the thirteenth NMOS transistor is connected to an output of the third amplifier, and a source of the thirteenth NMOS transistor is connected to ground, wherein the drain of the thirteenth NMOS transistor outputs the second biasing current.

9. The circuit of claim 2, wherein the biasing unit is also configured to generate a second biasing current tracking a threshold voltage of the CMOS transistors, wherein a ratio of the first biasing current and the second biasing current is adjustable.

10. The circuit of claim 2, wherein the CMOS transistors include PMOS transistors and NMOS transistors, and the first biasing current comprises a biasing current for the PMOS transistors and a biasing current for the NMOS transistors, wherein a ratio of the biasing current for the PMOS transistors and the biasing current for the NMOS transistor is based on respective sensitivities of delays of digital logic gate affected by PMOS transistor and NMOS transistor.

11. The circuit of claim 1, wherein the biasing unit is configured to generate a third biasing current, wherein the third biasing current flows through the CMOS transistor, such that a transconductance of the Complementary Metal-Oxide-Semiconductor (CMOS) transistor is constant, and the third biasing current also tracks a threshold voltage of the CMOS transistors.

12. The circuit of claim 1, wherein the biasing unit further comprises a fourteenth NMOS transistor, a fourteenth PMOS transistor, a third current source, a fourth amplifier, a fifteenth PMOS transistor, a sixteenth PMOS transistor, a seventh resistor, and an eighth resistor, wherein
the third current source is connected to a power supply, a source of the fourteenth PMOS transistor is connected to both the third current source and a negative input of the fourth amplifier, a drain of the fourteenth PMOS transistor is connected to both a gate of the fourteenth PMOS transistor and a drain and a gate of the fourteenth NMOS transistor, a source of the fourteenth NMOS transistor is connected to ground, the seventh resistor is connected to both a positive input of the fourth amplifier and a drain of the fifteenth PMOS transistor, a gate of the fifteenth PMOS transistor is connected to an output of the fourth amplifier, and a source of the fifteenth PMOS transistor is connected to the power supply, a gate of the sixteenth PMOS transistor is connected to the gate of the fifteenth PMOS transistor, a source of the sixteenth PMOS transistor is connected to the power supply, a drain of the sixteenth PMOS transistor is connected to ground via the eighth resistor, wherein the drain of the sixteenth PMOS transistor outputs the reference voltage.

13. A method, comprising
generating a first biasing current, the first biasing current flows through a Complementary Metal-Oxide-Semiconductor (CMOS) transistor, such that a transconductance of the Complementary Metal-Oxide-Semiconductor (CMOS) transistor is constant;

generating a reference voltage based on the first biasing current;

inputting the reference voltage into a positive input of an amplifier; and outputting a signal by the amplifier, wherein the output is fed back to a negative input of the amplifier and wherein the CMOS transistors include NMOS transistors, wherein the biasing unit comprises a first PMOS transistor, a second PMOS transistor, a third PMOS transistor, a first NMOS transistor, a second NMOS transistor, a third NMOS transistor, and a first resistor, wherein sources of the first, the second and the third PMOS transistors are connected to a power supply;

both a gate and a drain of the first PMOS transistor are connected to a drain of the first NMOS transistor;

a gate of the second PMOS transistor is connected to gates of both the first PMOS transistor and the third PMOS transistor;

a drain of the second PMOS transistor is connected to a gate of the first NMOS transistor and a drain of the second NMOS transistor;

a drain of the third PMOS transistor is connected to a gate of the second NMOS transistor and the first resistor;

the first resistor is connected to both a gate and a drain of the third NMOS transistor; and sources of the first, the second and the third NMOS transistors are connected to ground; wherein the drain of the third PMOS transistor is configured to output the first biasing current.

14. A method, comprising generating a first biasing current, the first biasing current flows through a Complementary Metal-Oxide-Semiconductor (CMOS) transistor, such that a transconductance of the Complementary Metal-Oxide-Semiconductor (CMOS) transistor is constant;

generating a reference voltage based on the first biasing current;

inputting the reference voltage into a positive input of an amplifier; and outputting a signal by the amplifier, wherein the output is fed back to a negative input of the amplifier, wherein the CMOS transistors comprise PMOS transistors, wherein the biasing unit comprises a sixth NMOS transistor, a seventh NMOS transistor, an eighth NMOS transistor, a seventh PMOS transistor, an eighth PMOS transistor, and a third resistor, wherein sources of the sixth, the seventh and the eighth NMOS transistors are connected to ground;

both a gate and a drain of the sixth NMOS transistor are connected to both a drain of the seventh PMOS and a gate of the seventh NMOS transistor;

the gate of the seventh NMOS transistor is connected to a gate of the eighth NMOS transistor;

a drain of the seventh NMOS transistor is connected to a gate of the seventh PMOS transistor and a drain of the eighth PMOS transistor;

a drain of the eighth NMOS transistor is connected to a gate of the eighth PMOS transistor and the third resistor; and sources of the seventh and the eighth PMOS transistors are connected to the power supply; wherein the drain of the eighth NMOS transistor is configured to output the second biasing current.

15. A method, comprising generating a first biasing current, the first biasing current flows through a Complementary Metal-Oxide-Semiconductor (CMOS) transistor, such that a transconductance of the Complementary Metal-Oxide-Semiconductor (CMOS) transistor is constant;

generating a reference voltage based on the first biasing current;

inputting the reference voltage into a positive input of an amplifier; and outputting a signal by the amplifier, wherein the output is fed back to a negative input of the amplifier, wherein the CMOS transistors include PMOS transistors, wherein the biasing unit comprises a ninth PMOS transistor, a tenth PMOS transistor, an eleventh PMOS transistor, a ninth NMOS transistor, a tenth NMOS transistor, an eleventh NMOS transistor, and a fourth resistor, wherein sources of the ninth, the tenth and the eleventh NMOS transistors are connected to ground;

both a gate and a drain of the ninth NMOS transistor are connected to both a drain of the ninth PMOS transistor and a gate of the tenth NMOS;

the gate of the tenth NMOS transistor is connected to a gate of the eleventh NMOS transistor;

a drain of the tenth NMOS transistor is connected to a gate of the ninth PMOS transistor and a drain of the tenth PMOS transistor;

a drain of the eleventh NMOS transistor is connected to a gate of the tenth PMOS transistor and the fourth resistor;

the fourth resistor is connected to both a gate and a drain of the eleventh PMOS transistor; and sources of the ninth, the tenth and the eleventh PMOS transistors are connected to the power supply; wherein the drain of the eleventh NMOS transistor is configured to output the first biasing current.

16. A method, comprising generating a second biasing current tracking a threshold voltage of Complementary Metal-Oxide-Semiconductor (CMOS) transistors;

generating a reference voltage based on the second biasing current;

inputting the reference voltage into a positive input of an amplifier; and outputting a signal by the amplifier, wherein the output is fed back to a negative input of the amplifier.

17. The method of claim 16, wherein the CMOS transistors include NMOS transistors, and the biasing unit comprises a fourth PMOS transistor, a fifth PMOS transistor, a sixth PMOS transistor, a fourth NMOS transistor, a fifth NMOS transistor, and a second resistor, wherein sources of the fourth, the fifth and the sixth PMOS transistors are connected to a power supply;

both a gate and a drain of the fourth PMOS transistor are connected to a drain of the fourth NMOS transistor;

a gate of the fifth PMOS transistor is connected to a source of the sixth PMOS transistor;

a drain of the fifth PMOS transistor is connected to gates of both the fourth NMOS transistor and the fifth NMOS transistor;

a drain of the sixth PMOS transistor is connected to a gate of the fifth NMOS transistor and the second resistor; and sources of the fourth and the fifth NMOS transistors are connected to ground; wherein the drain of the sixth PMOS transistor is configured to output the second biasing current.

18. The method of claim 16, wherein the CMOS transistors include a NMOS transistor, wherein the biasing unit comprises a twelfth NMOS transistor, a second amplifier, a first current source, a twelfth PMOS transistor, and a fifth resistor, wherein the first current source is connected to a power supply, a drain of the twelfth NMOS transistor is connected to both the first current source and a negative input of the second amplifier, a source of the twelfth NMOS transistor is connected to both ground and the fifth resistor, the fifth resistor is connected to both a positive input of the second amplifier and a drain of the twelfth PMOS transistor, a gate of the twelfth PMOS transistor is connected to an output of the second amplifier, and a source of the twelfth PMOS transistor is connected to the power supply, wherein the drain of the twelfth PMOS transistor outputs the second biasing current.

19. The method of claim 16, wherein the CMOS transistors include a PMOS transistor, wherein the biasing unit comprises a thirteenth NMOS transistor, a third amplifier, a second current source, a thirteenth PMOS transistor, and a sixth resistor, wherein the second current source is connected to ground, a drain of the thirteenth PMOS transistor is connected to both the second current source and a negative input of the third amplifier, a source of the thirteenth PMOS transistor is connected to a power supply, the sixth resistor is connected to both a positive input of the third amplifier and a drain of the thirteenth NMOS transistor, a gate of the thirteenth NMOS transistor is connected to an output of the third amplifier, and a source of the thirteenth NMOS transistor is connected to ground, wherein the drain of the thirteenth NMOS transistor outputs the second biasing current.

* * * * *